(12) United States Patent  
Cai et al.

(10) Patent No.: US 8,841,711 B1  
(45) Date of Patent: Sep. 23, 2014

(54) METHODS OF INCREASING SPACE FOR CONTACT ELEMENTS BY USING A SACRIFICIAL LINER AND THE RESULTING DEVICE

(71) Applicants: GLOBALFOUNDRIES Inc., Grand Cayman (KY); International Business Machines Corporation, Armonk, NY (US)

(72) Inventors: Xiuyu Cai, Niskayuna, NY (US); Ruilong Xie, Niskayuna, NY (US); Ali Khakifirooz, Mountain View, CA (US); Kangguo Cheng, Schenectady, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/797,001

(22) Filed: Mar. 12, 2013

(51) Int. Cl.
| | |
|---|---|
| *H01L 29/78* | (2006.01) |
| *H01L 21/336* | (2006.01) |
| *H01L 29/417* | (2006.01) |
| *H01L 29/40* | (2006.01) |

(52) U.S. Cl.  
CPC ........ *H01L 29/401* (2013.01); *H01L 29/41775* (2013.01)

USPC .......................................... 257/288; 438/197

(58) Field of Classification Search  
USPC ................................... 257/288; 438/197, 303  
See application file for complete search history.

(56) References Cited

U.S. PATENT DOCUMENTS

| 6,010,935 A * | 1/2000 | Doan ............................. 438/303 |
| 2007/0296039 A1* | 12/2007 | Chidambarrao et al. ..... 257/355 |
| 2013/0248950 A1* | 9/2013 | Kang et al. .................... 257/288 |

* cited by examiner

*Primary Examiner* — Daniel Shook  
(74) *Attorney, Agent, or Firm* — Amerson Law Firm, PLLC

(57) ABSTRACT

One method includes forming a sidewall spacer adjacent a gate structure, forming a first liner layer on the sidewall spacer, forming a second liner layer on the first liner layer, forming a first layer of insulating material above the substrate and adjacent the second liner layer, selectively removing at least portions of the second liner layer relative to the first liner layer, forming a second layer of insulating material above the first layer of insulating material, performing at least one second etching process to remove at least portions of the first and second layers of insulating material and at least portions of the first liner layer so as to thereby expose an outer surface of the sidewall spacer, and forming a conductive contact that contacts the exposed outer surface of the sidewall spacer and a source/drain region of the transistor.

21 Claims, 6 Drawing Sheets

METHODS OF INCREASING SPACE FOR CONTACT ELEMENTS BY USING A SACRIFICIAL LINER AND THE RESULTING DEVICE

BACKGROUND OF THE INVENTION

1. Field of the Invention

The present disclosure generally relates to the fabrication of integrated circuits, and, more particularly, to various methods of increasing the available space for contact elements, such as self-aligned contacts for a semiconductor device, by use of a sacrificial liner layer.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

By using such field effect transistors, more complex circuit components may be composed, such as inverters and the like, thereby forming complex logic circuitry, embedded memories and the like. Over the recent years, due to the reduced dimensions of the transistor devices, the operating speed of the circuit components has been increased with every new device generation and the "packing density" in such products has been increased over the recent years. i.e., there are an increased number of devices per unit area. Such improvements in the performance of transistor devices has reached the point where the limiting factor of the ultimate operating speed of complex integrated circuit products is no longer the individual transistor element but the electrical performance of the complex wiring system that is formed above the semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density has mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with the density of circuit elements in the device level.

As device dimensions have decreased, e.g., transistors with gate lengths of 50 nm and less, the contact elements in the contact level have to have critical dimensions on the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the contact regions of the transistors, thereby providing self-aligned trenches which are substantially laterally delineated by the liner structures that are formed on the sidewall spacers positioned adjacent the gate electrode structures. Consequently, a corresponding lithography process only needs to define a global contact opening above an active region, wherein the contact trenches then result from the selective etch process using the gate electrode structures (including spacers plus liners), i.e., the portions exposed by the global contact opening, as an etch mask. Thereafter, an appropriate contact material, such as tungsten and the like, may be filled into the contact trenches.

However, the reduction in feature sizes as well and the pitch between adjacent transistor devices has reached the point where there is simply very little space available for the contact element to make electrical contact to source/drain regions of a transistor device. FIG. 1 schematically illustrates a cross-sectional view of an illustrative prior art integrated circuit product 10 at an advanced manufacturing stage. As illustrated, the product 10 comprises a plurality of illustrative gate structures 11 that are formed above a substrate 12, such as a silicon substrate. The gate structures 11 are comprised of an illustrative gate insulation layer 13 and an illustrative gate electrode 14. An illustrative gate cap layer 16, liner layer 17 and sidewall spacers 18 encapsulate and protect the gate structures 11. The gate cap layer 16, liner layer 17 and sidewall spacers 18 are typically made of silicon nitride. Also depicted in FIG. 1 are a plurality of raised source/drain regions 20 and a layer of insulating material 22, e.g., silicon dioxide. The liner layer 17 is provided as a means of protecting the source/drain regions 20 when an etching process is performed to define contact openings for the contacts that will be formed in such openings to establish electrical connection to the source/drain region 20. Typically, after the contact opening is formed, a brief "punch-through" etching process is performed to remove or clear the liner material from above the source/drain region 20 just prior to forming the conductive contact in the contact opening. As mentioned above, there is very little space available in the region 19 for a contact to land and make contact to the underlying source/drain region 20. Moreover, even if contact can be made, the small contact area results in an undesirable localized increase in electrical resistance and heating of the device 10.

The present disclosure is directed to various methods of increasing the available space for contact elements, such as self-aligned contacts for a semiconductor device, by use of a sacrificial liner layer, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of increasing the available space for contact elements, such as self-aligned contacts for a semiconductor device, by use of a sacrificial liner layer. One method disclosed includes forming a gate structure above a semiconductor substrate, forming a sidewall spacer adjacent the gate structure, forming a first liner layer on the sidewall spacer, forming a second liner layer on the first liner layer, forming a first layer of insulating material above the substrate and adjacent the second liner layer, performing at least one etching process to selectively remove at least portions of the second liner layer relative to the first liner layer and the first layer of insulating material so as to thereby form a space between the first layer of insulating material and the first liner layer, and forming a second layer of insulating material above the first layer of insulating material.

A further illustrative method disclosed herein includes forming a gate structure above a semiconductor substrate, forming a sidewall spacer adjacent the gate structure, forming a first liner layer on the sidewall spacer, forming a second liner layer on the first liner layer, forming a first layer of insulating material above the substrate and adjacent the second liner layer, performing at least one first etching process to selectively remove at least portions of the second liner layer relative to the first liner layer, forming a second layer of insulating material above the first layer of insulating material, performing at least one second etching process to remove at least portions of the first and second layers of insulating material and at least portions of the first liner layer so as to thereby expose an outer surface of the sidewall spacer, and forming a conductive contact that is in physical contact with the exposed outer surface of the sidewall spacer and conductively coupled to a source/drain region of the transistor.

One illustrative example of a novel transistor device disclosed herein includes a gate structure positioned above a semiconductor substrate, a sidewall spacer positioned adjacent opposite sides of the gate structure, a first layer of insulating material positioned above the substrate, wherein the first layer of insulating material is laterally spaced apart from and not in contact with the sidewall spacer, a second layer insulating material positioned above the first layer of insulating material, wherein the second layer of insulating material contacts the sidewall spacer, and first and second air gaps positioned on opposite sides of the gate structure, wherein each of the first and second air gaps is defined, in part, by an outer surface of the sidewall spacer, the first layer of insulating material, the second layer of insulating material and an upper surface of the substrate.

Yet another example of a novel transistor device disclosed herein includes a gate structure positioned above a semiconductor substrate, a source/drain region, a sidewall spacer positioned adjacent opposite sides of the gate structure and a conductive contact that is in physical contact with an outer surface of the sidewall spacer and conductively coupled to the source/drain region of the transistor.

BRIEF DESCRIPTION OF THE DRAWINGS

The disclosure may be understood by reference to the following description taken in conjunction with the accompanying drawings, in which like reference numerals identify like elements, and in which.

Figure 1:
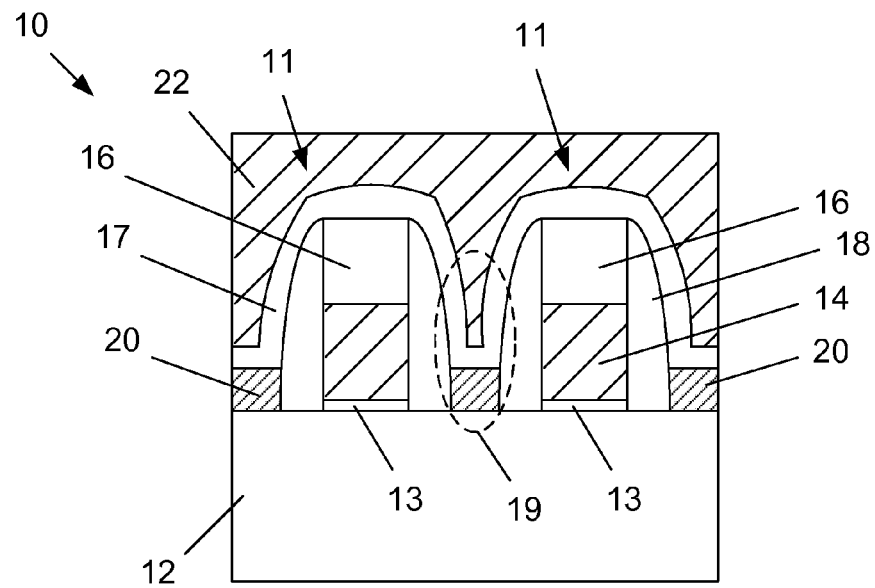
FIG. 1 schematically illustrates a cross-sectional view of an illustrative prior art integrated circuit product that employs self-aligned contacts.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of increasing the available space for contact elements, such as self-aligned contacts for a semiconductor device, by use of a sacrificial liner layer. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail. As will be appreciated by those skilled in the art after a complete reading of the present application, the inventions disclosed herein may be employed in forming planar transistor devices (NFET or PFET devices), as well as so-called 3-D devices, such as FinFETs. For purposes of disclosure, reference will be made to an illustrative process flow for forming an integrated circuit product comprised of planar transistor devices. However, the inventions disclosed herein should not be considered to be limited to such an illustrative example.

Figure 2A:
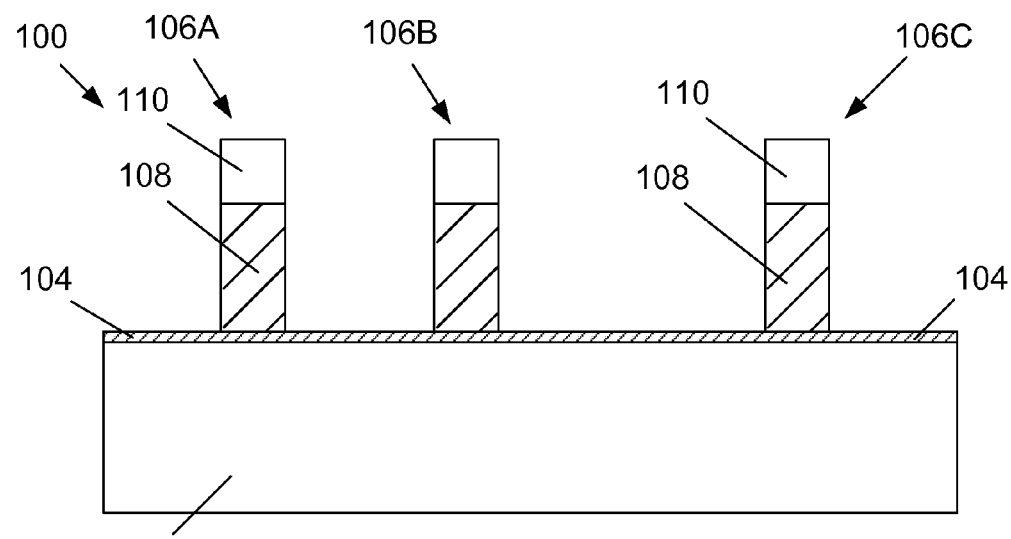
FIGS. 2A-2K depict various methods disclosed herein for increasing the available space for contact elements, such as self-aligned contacts for a semiconductor device, by use of a sacrificial liner layer, and various novel device structures.

FIG. 2A is a simplified view of an illustrative integrated circuit device or product 100 at an early stage of manufacturing. Illustrative transistors 106A-C will be formed in and above the semiconductor substrate 102. The pitch between the transistors 106A-B is tighter (smaller) than the pitch between the transistors 106B-C. So as not to obscure the inventions disclosed herein, isolation regions that are formed in the substrate to define active regions where the transistors 106A-C will be formed are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate," "semiconductor substrate" or "semiconducting substrate" should be understood to cover all semiconducting materials and all forms of such materials.

In the example disclosed herein, the transistors 106A-C will be formed using a replacement gate technique. However, as will be appreciated by those skilled in the art after a complete reading of the present application, the novel inventions disclosed herein may also be employed in the context of using so-called "gate-first" manufacturing techniques. Accordingly, with continuing reference to FIG. 2A, the process begins with the formation of a sacrificial gate insulation layer 104, such as silicon dioxide (sometimes referred to as a "dummy oxide") on the substrate 102. The sacrificial gate insulation layer 104 may be formed by performing a thermal growth process or a deposition process. Also depicted in FIG. 2A are schematically depicted sacrificial gate electrodes 108 with a gate cap layer 110 formed thereabove. Such structures and layers may be formed using a variety of different materials and by performing a variety of known techniques. For example, the sacrificial gate electrodes 108 may be comprised of polysilicon or amorphous silicon and the gate cap layers 110 may be comprised of silicon nitride. The sacrificial gate insulation layer 104, sacrificial gate electrodes 108 and the gate cap layer 110 may be of any desired thickness or configuration. Of course, those skilled in the art will recognize that there are other features of the transistors 106A-C that are not depicted in the drawings so as not to obscure the present invention. For example, so-called halo implant regions and various layers or regions of silicon/germanium that are typically found in high performance PFET transistors are not depicted in the drawings. The sacrificial gate electrodes 108 and the gate cap layers 110 may be formed by depositing the appropriate layers of material using any of a variety of different known techniques, e.g., a chemical vapor deposition (CVD) process, an atomic layer deposition (ALD) process, a thermal growth process, etc. Thereafter, one or more patterning and etching processes are performed on the deposited layers of material to define the sacrificial gate electrodes 108 and the gate cap layers 110. Typically, the gate cap layers 110 are patterned using known photolithography and etching techniques to thereby define a patterned gate cap layer. Thereafter, one or more etching processes are performed through the patterned gate cap layer to remove exposed portions of the sacrificial gate electrode material layer to thereby define the depicted sacrificial gate electrodes 108.

Figure 2B:
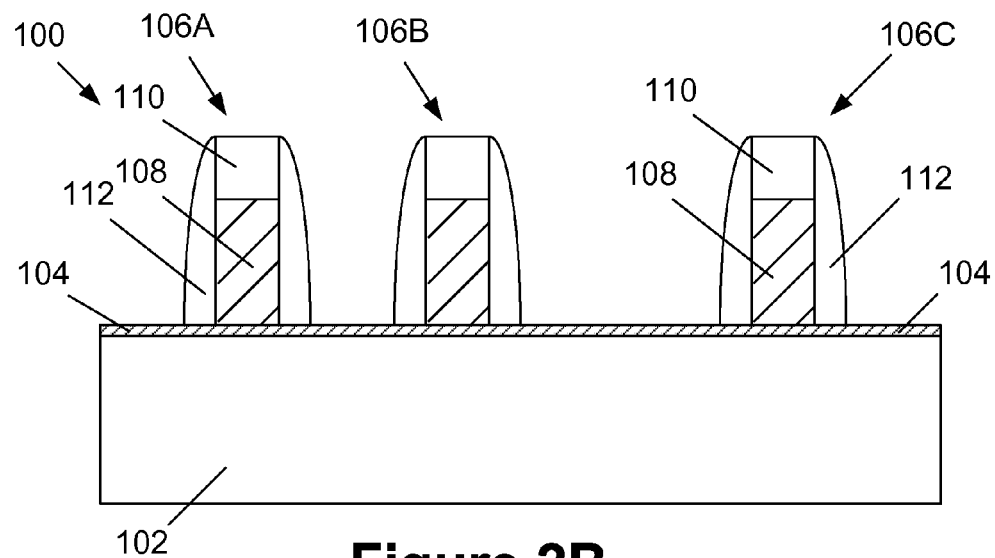

FIG. 2B depicts the device 100 after an illustrative sidewall spacer 112 was formed adjacent the sacrificial gate electrodes 108. The sidewall spacer 112 may be formed by depositing a layer of spacer material and thereafter performing an anisotropic etching process. The sidewall spacer 112 may be comprised of a variety of different materials, e.g., silicon nitride, silicon oxynitride, etc. The base thickness of the sidewall spacer 112 may vary depending upon the particular application. In one illustrative embodiment, the sidewall spacer 112 may have a thickness at its base of about 5-10 nm.

Figure 2C:
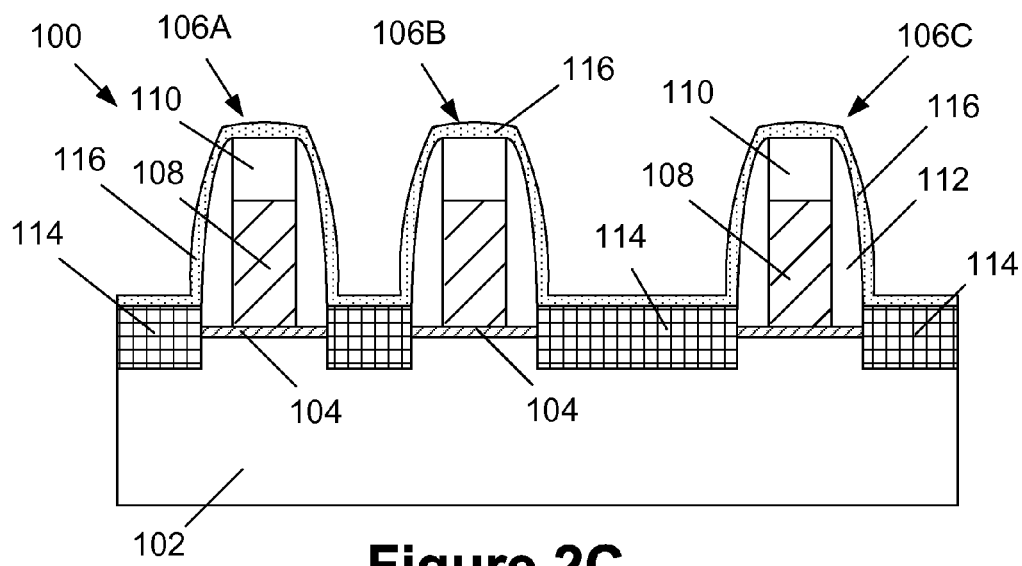

FIG. 2C depicts the device 100 after several process operations have been performed. First, various known process operations are performed to form illustrative raised source/drain regions 114 in the substrate 102 adjacent the sidewall spacers 112. However, such raised source/drain regions 114 need not be formed in all applications, and the disclosed inventions should not be considered to be limited to such an illustrative configuration. That is, the inventions disclosed herein may be employed with transistor devices that have traditional, planar source/drain regions. The raised source/drain regions 114 may be formed by forming cavities in the substrate 102 and thereafter performing an epitaxial deposition process to thereby form doped semiconductor material in the cavities. Although not depicted in the drawings, an extension implantation process may be performed to form extension implant regions (not shown) in the substrate 102 prior to or after the formation of the sidewall spacers 112. After the formation of the source/drain regions 114, a conformably deposited first liner layer 116 (comprised of an insulating material) having a thickness of about 2-5 nm is formed on the device 100. In one illustrative embodiment, the first liner layer 116 is deposited on the sidewall spacers 112. The first liner layer 116 should be comprised of a material that exhibits good etch selectivity relative to the material selected for the sidewall spacers 112. In one illustrative embodiment, where the sidewall spacers 112 are made of silicon nitride, the first liner layer 116 may be comprised of silicon dioxide, etc., and it may be formed by performing an ALD or CVD process.

Figure 2D:
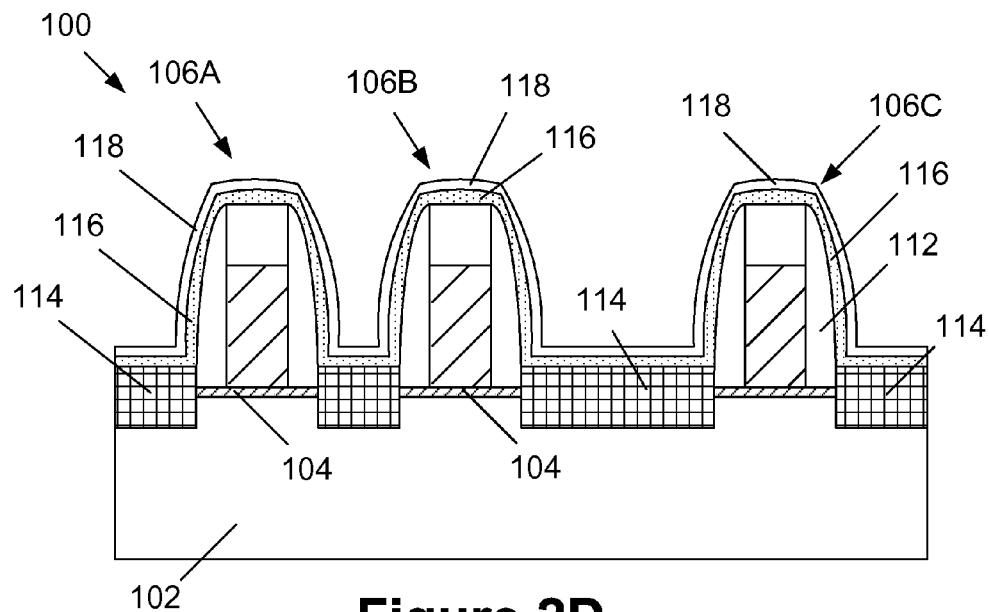

FIG. 2D depicts the device 100 after a conformably deposited second liner layer 118 (comprised of an insulating material) having a thickness of about 2-5 nm is formed on the device 100. As will be discussed more fully below, the second liner layer 118 is sacrificial in nature as most, if not all, of the second liner layer 118 will be removed as fabrication continues. In one illustrative embodiment, the second liner layer 118 is deposited on the first liner layer 116. The second liner layer 118 should be comprised of a material that exhibits good etch selectivity relative to the material selected for the first liner layer 116. In one illustrative embodiment, where the first liner layer 116 is made of silicon dioxide, the second liner layer 118 may be comprised of silicon nitride, etc., and it may be formed by performing an ALD or CVD process.

Figure 2E:
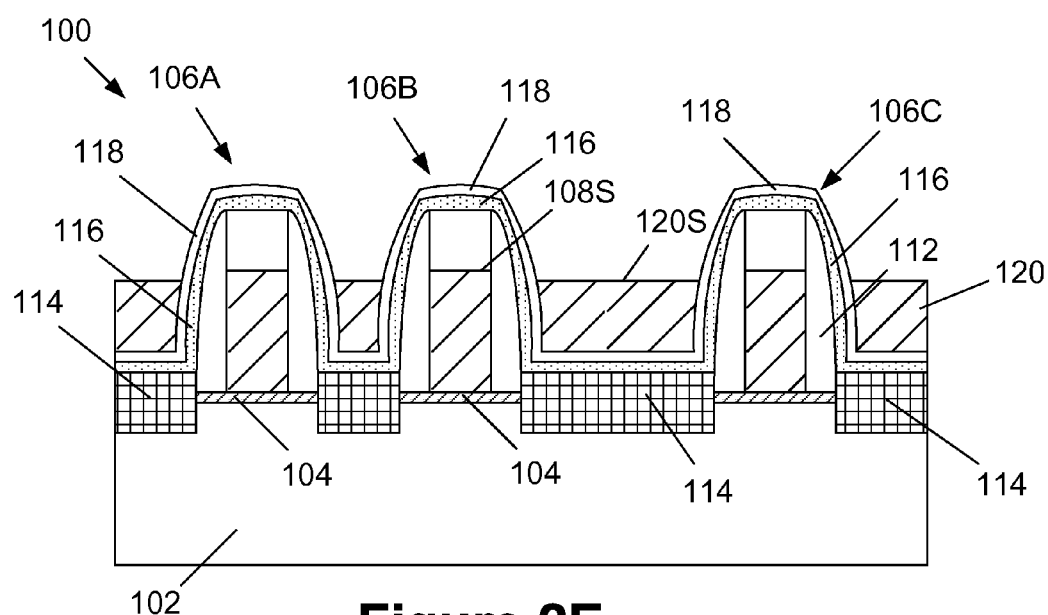

Then, as shown in FIG. 2E, a layer of insulating material 120 is blanket-deposited over the device 100. In one illustrative example, the layer of insulating material 120 may be a silicon dioxide material, such as a flowable oxide material, and it may be formed using traditional techniques, e.g., CVD, spin-on/cure, etc. In one particular example, the layer of insulating material 120 is formed such that its upper surface 120S is positioned slightly below the upper surface 108S of the sacrificial gate electrodes 108. This may be accomplished by initially depositing the layer of insulating material 120 such that it overfills the spaces between the gate structures, performing a chemical mechanical polishing (CMP) process that stops on the second liner layer 118, and thereafter performing a timed, recess etching process (sometimes referred to as an etch-back process) until such time as the upper surface 120S of the layer of insulating material 120 is at the desired height level.

Figure 2F:
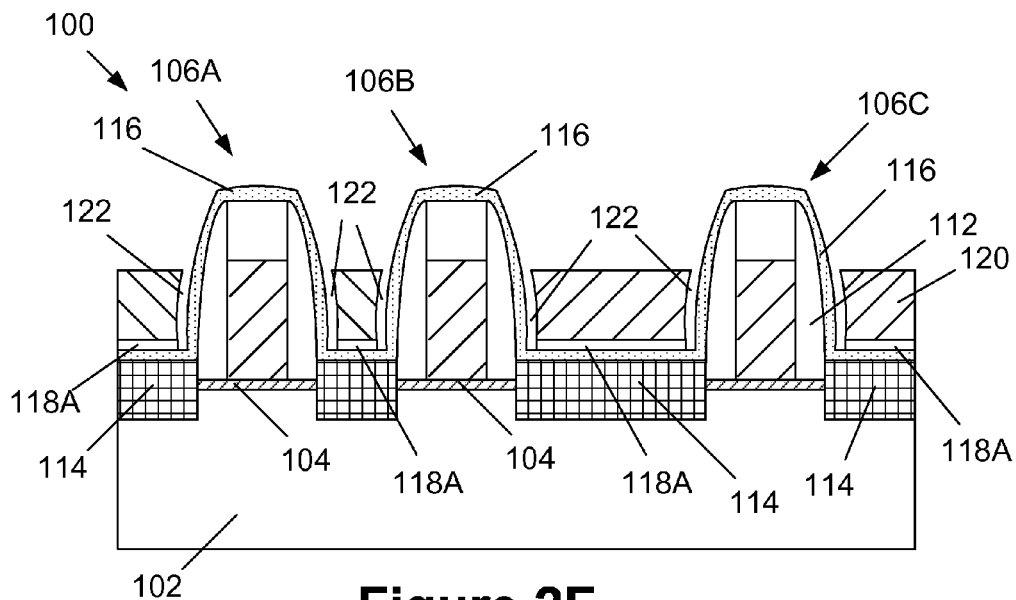

Next, as shown in FIG. 2F, a wet etching process is performed to remove at least portions of the sacrificial second liner layer 118 relative to the first liner layer 116 and the layer of insulating material 120. In the case where the first liner layer 116 and the layer of insulating material 120 are comprised of silicon dioxide and the sacrificial second liner layer 118 is comprised of silicon nitride, the wet etching process may be performed using, for example, an etching chemistry comprised of hot phosphoric acid. This etching process results in the formation of gaps or pockets 122 that were formerly occupied by the removed portions of the sacrificial second liner layer 118. Note that, in the depicted example, the above-described etching process does not remove the entire sacrificial second liner layer 118 as remaining portions 118A of the sacrificial second liner layer 118 may still be present under portions of the layer of insulating material 120.

Figure 2G:
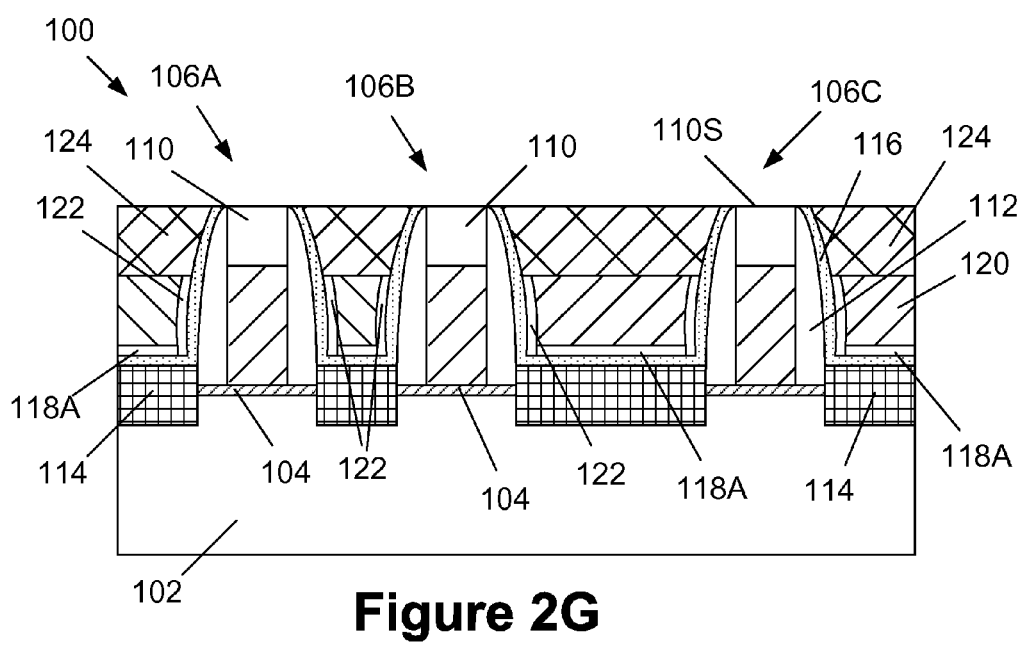

FIG. 2G depicts the product 100 after several process operations have been performed. First, a layer of insulating material 124 was blanket-deposited across the product 100. The layer of insulating material 124 may be comprised of a variety of different materials, such as silicon dioxide, a low-k (k value less than 3.3) material, etc., and it may be formed by performing a variety of techniques, e.g., CVD, etc. The thickness of the layer of insulating material 124 may vary depending upon the particular application. Thereafter, one or more CMP processes were performed on the layer of insulating material 124. The CMP process stopped on the upper surface 110S of the gate cap layers 110, i.e., the gate cap layers 110 were used as a polish stop. In this example, the CMP process also removes portions of the first liner layer 116 that were positioned above the gate cap layers 110. Note that, given the relatively high aspect ratio of the gaps or pockets 122, they may remain substantially unfilled, i.e., they may effectively become air gaps, when the layer of insulating material 124 is deposited on the device 100.

Figure 2H:
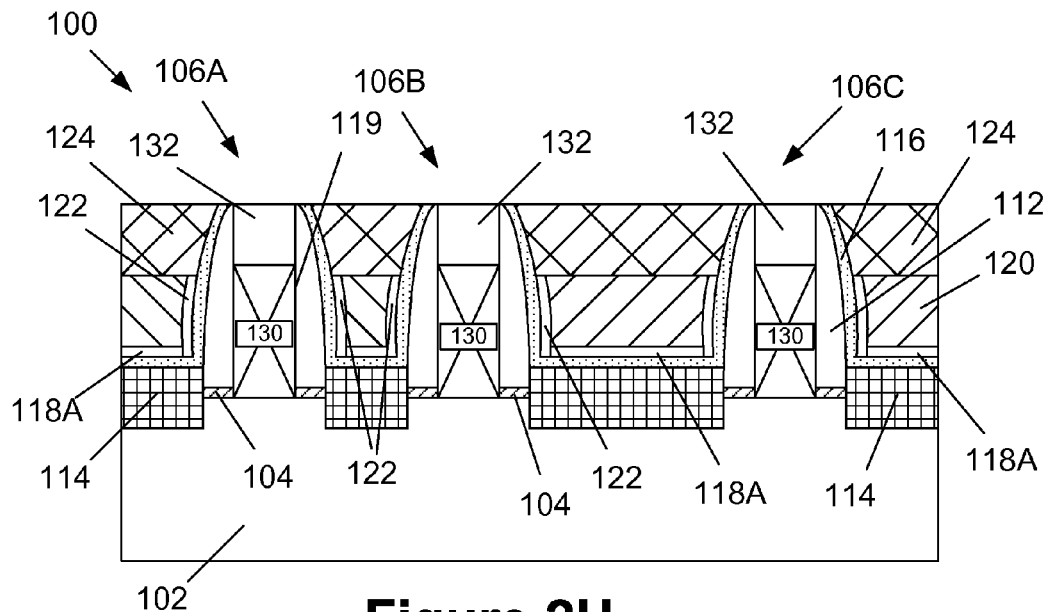

FIG. 2H depicts the device after several process operations were performed that involved removing the sacrificial gate electrodes 108 and the sacrificial gate insulation layer 104, and the formation of a replacement gate structure 130 for the transistors 106A-C. The process used to remove the sacrificial gate materials and replace them with desired final gate materials are well known to those skilled in the art, and thus should not be considered to be limitations of the presently disclosed inventions. Nevertheless, a brief description of at least some of the activities that may be performed to accomplish this objective will now be discussed.

Initially, one or more etching processes were performed to remove the gate cap layers 110, the sacrificial gate electrodes 108 and portions of the sacrificial gate insulation layer 104 exposed by the removal of the sacrificial gate electrodes 108 to thereby define a plurality of gate cavities 119 where the replacement gate structures 130 will subsequently be formed. Note that the gate cavities 119 are each laterally defined by the sidewall spacers 112 at this point in the process flow. Typically, the sacrificial gate insulation layer 104 is removed as part of the replacement gate technique, as depicted herein. However, the sacrificial gate insulation layer 104 may not be removed in all applications. Even in cases where the sacrificial gate insulation layer 104 is intentionally removed, there will typically be a very thin native oxide layer (not shown) that forms on the substrate 102 within the gate cavities 119.

As shown in FIG. 2H, schematically depicted replacement gate structures 130 for the transistors 106A-C were formed in the gate cavities 119. The schematically depicted gate structure 130 includes a gate insulation layer and one or more layers of conductive material that act as the gate electrode for the transistor. As will be recognized by those skilled in the art after a complete reading of the present application, the gate structure 130 of the devices 100 depicted in the drawings, i.e., the gate insulation layer and the gate electrode, is intended to be representative in nature. For example, the gate insulation layer may be comprised of a variety of different materials, such as, for example, silicon dioxide, a so-called high-k (k greater than 10) insulation material (where k is the relative dielectric constant), etc. The gate electrode may be comprised of one or more layers of conductive material, e.g., polysilicon, tungsten, aluminum, one or more layers of metal, etc. As noted above, in some cases, if desired, a metal layer (not shown), such as a very thin work function adjusting metal (e.g., a layer of titanium nitride), may be formed on a high-k gate insulation layer. As will be recognized by those skilled in the art after a complete reading of the present application, the insulating materials and the metal layer(s) that are part of the replacement gate structure 130 may be of any desired construction and comprised of any of a variety of different materials. Additionally, the replacement gate structure 130 for an NFET device may have different material combinations as compared to a replacement gate structure 130 for a PFET device. Thus, the particular details of construction of replacement gate structure 130, and the manner in which such a replacement gate electrode structure 130 is formed, should not be considered a limitation of the present invention unless such limitations are expressly recited in the attached claims.

In one illustrative example, the replacement gate formation process begins with performing a conformal deposition process to form a high-k gate insulation layer (not shown) in the gate cavities 119 and above the layer of insulating material 124 followed by performing a high temperature anneal process in an attempt to anneal out or repair any defects in the high-k gate insulation layer. Thereafter, the conductive materials that will be used for the gate electrode, e.g., one or more metal layers, will be deposited across the devices by performing one or more conformal deposition processes and/or one or more blanket-deposition processes so as to substantially overfill the gate cavities 119 with conductive gate electrode material(s). At that point, one or more CMP processes are performed to remove excess portions of the gate insulation layer and the layers of conductive material that will be used to form the gate electrode positioned above the layer of insulating material 124. This CMP process essentially planarizes the upper surface of the materials of the gate structure 130 with the upper surface of the layer of insulating material 124. Thereafter, an etching process is performed to reduce the height of the replacement gate structure 130 such that the upper surface of the replacement gate electrode is positioned below the upper surface of the layer of insulating material 124. Next, an illustrative gate cap layer 132, comprised of, for example, silicon nitride, was formed above the recessed gate structure 130. The gate cap layer 132 may be formed by depositing a layer of the cap material and thereafter performing a CMP process to remove excess portions of the cap material positioned on top of the layer of insulating material 124. These process operations result in the structure depicted in FIG. 2H.

Figure 2I:
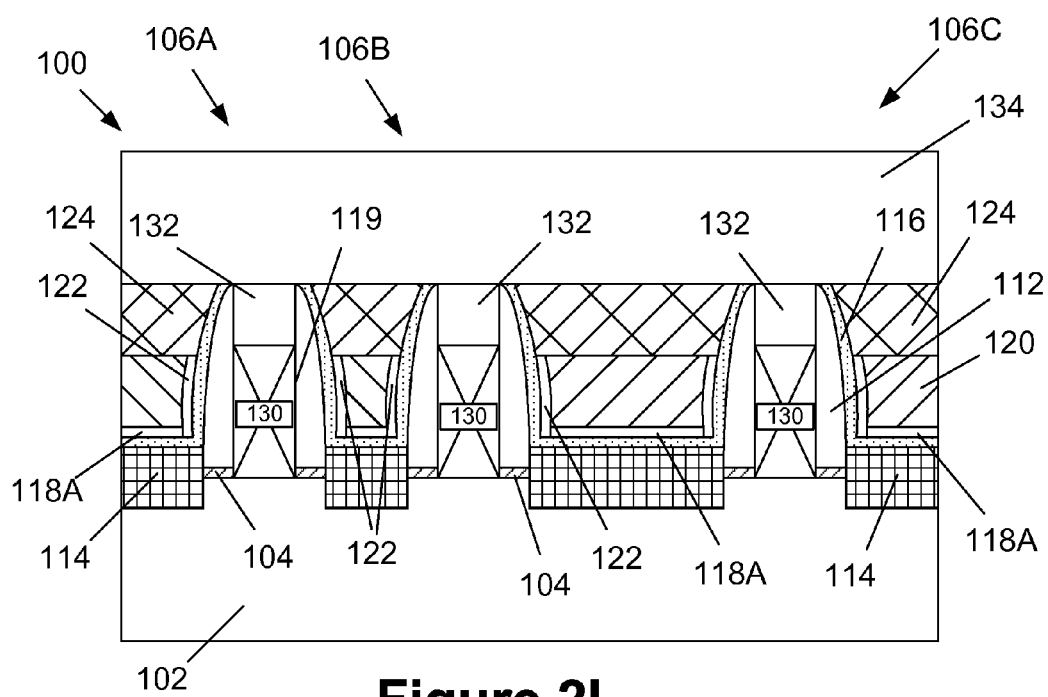

FIG. 2I depicts the product 100 after a layer of insulating material 134 has been deposited across the product 100. The layer of insulating material 134 may be comprised of a variety of different materials, such as silicon dioxide, a low-k (k value less than 3.3) material, etc., and it may be formed by performing a variety of techniques, e.g., CVD, etc. The thickness of the layer of insulating material 134 may vary depending upon the particular application.

Figure 2J:
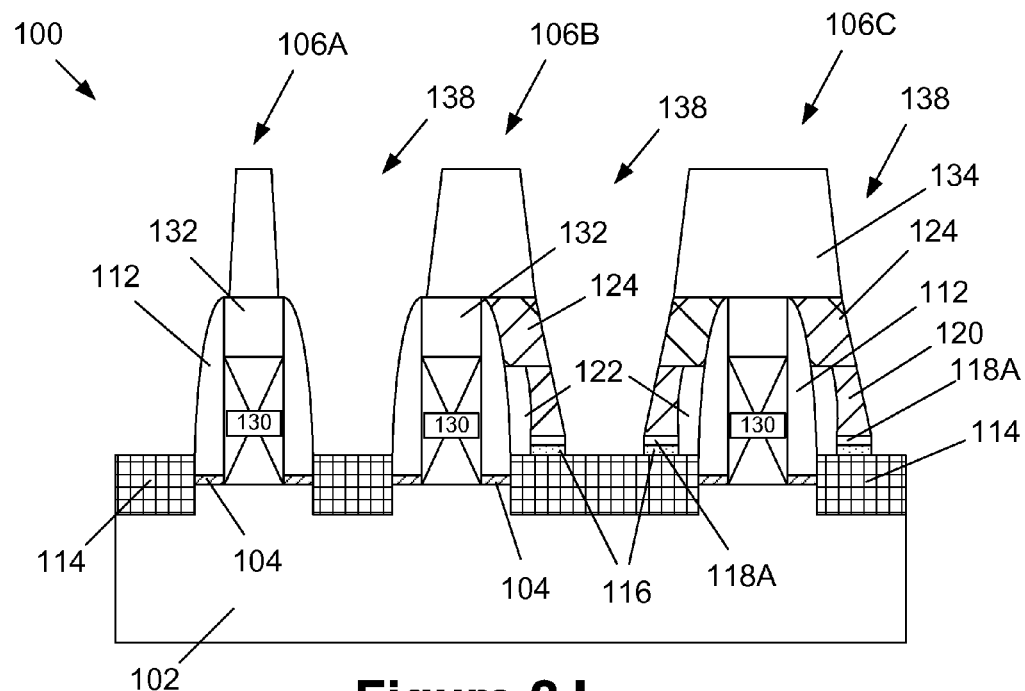

FIG. 2J depicts the product 100 after one or more etching processes were performed on the product 100 through a patterned etch mask (not shown), such as a patterned layer of photoresist material, to define contact openings 138 where conductive contacts will be formed to establish electrical connection to the source/drain regions. As depicted, for closely spaced transistors, e.g., transistors 106A-B, the etching process(es) performed to form the contact openings 138 remove portions of the layer of insulating material 134 and substantially all of the oxide materials, e.g., the layers of insulating materials 120, 124 and the first liner layer 116 positioned between the gate structures of the transistors 106A-B. To the extent any residual portions 118A of the sacrificial liner layer 118 remain, the etching process(es) may include a brief etching process to insure that none of the remaining portions of the sacrificial second liner layer 118 are positioned above the source/drain regions 114. However, in the case of densely packed transistors, such as the transistors 106A-B, there will be so little of the sacrificial second liner layer 118 remaining between such transistors such that the oxide etching process(es) will also remove any such residual materials from the sacrificial second liner layer 118. In the case where transistors are spaced relatively far apart, such as the transistors 106B-C, it is likely that there will be some remaining portions of the sacrificial second liner layer 118 present above the source/drain regions 114. In such an application, the etching process(es) used to form the contact openings 138 may involve an initial etching process to remove silicon dioxide materials, e.g., the layers 134, 124, 120 and 116, followed by a brief etching process that uses an etch chemistry adapted to remove any residual portions of the sacrificial second liner layer 118. Thereafter another etching process may be performed to remove any remaining portions of the first liner layer 116 within the contact opening 138 that may have been positioned under remaining portions 118A of the sacrificial second liner layer 118. For example, as depicted in FIG. 2J, residual portions of both the first liner layer 116 and the second sacrificial second liner layer 118 are positioned adjacent the air gaps 122 of the transistor 106C. In contrast, given the densely packed relationship of the transistors 106A-B, there is no such air gap present, due to the consumption of the layers of insulating material 120, 124 between the two transistors. In the drawings, it is assumed that another densely packed transistor (not shown) is present to the left of the transistor 106A and that another non-densely packed transistor (not shown) is present to the right of the transistor 106C.

Figure 2K:
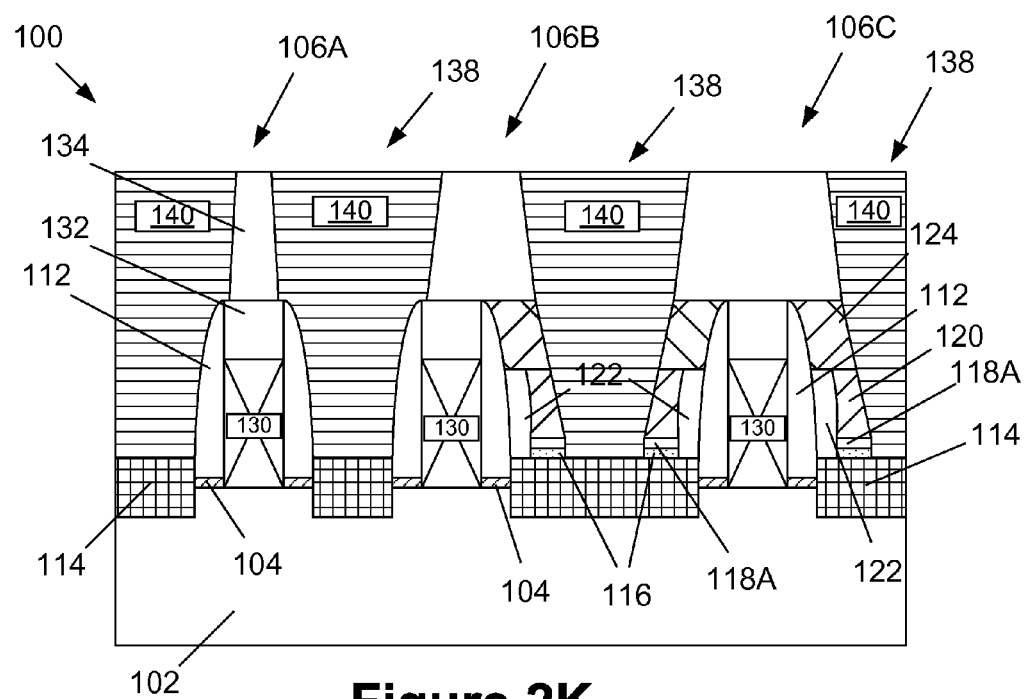

FIG. 2K depicts the product 100 after conductive, self-aligned contact structures 140 have been formed in the self-aligned contact openings 138 such that they are conductively coupled to the source/drain regions 114. The self-aligned contact structures 140 are intended to be schematic and representative in nature, as they may be formed using any of a variety of different conductive materials and by performing traditional manufacturing operations. The self-aligned contact structures 140 may also contain one or more barrier layers (not depicted). In one illustrative example, the self-aligned contact structures 140 may be formed by depositing a liner, e.g., a titanium nitride liner, followed by overfilling the self-aligned contact openings 138 with a conductive material, such as tungsten. Thereafter, a CMP process may be performed to planarize the upper surface of the layer of insulating material 134 which results in the removal of excess portions of the liner and the tungsten positioned above the layer of insulating material 134 outside of the self-aligned contact openings 138 and the formation of the self-aligned contact structures 140. If desired, a metal silicide material (not shown) may be formed on the source/drain regions 114 prior to forming the self-aligned contact structures 140.

Note that the method disclosed herein involve effectively removing the liner layer 17 discussed in the background section of this application. As a result, there is physically more space between the gate structures or, more precisely, between the sidewall spacers on the transistors 106A-B than would be present if the prior art liner layer 17 were still in position. Additionally, in the case of less densely packed transistors, the methods disclosed herein allow formation of the depicted air gaps 122 between the gate electrodes of the replacement gate structures 130 and the contacts 140. The presence of the air gaps 122 reduces the parasitic capacitance between the gate electrode and the contact 140.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention.

Accordingly, the protection sought herein is as set forth in the claims below.

What is claimed:

1. A method of forming a transistor, comprising:
   forming a gate structure above a semiconductor substrate;
   forming a sidewall spacer adjacent said gate structure;
   forming a first liner layer on at least said sidewall spacer;
   forming a second liner layer on said first liner layer;
   forming a first layer of insulating material above said substrate and adjacent said second liner layer, said first layer of insulating material covering a lower portion of a sidewall surface of said second liner layer and exposing an upper portion of said sidewall surface;
   performing at least one etching process to selectively remove at least portions of said second liner layer relative to said first liner layer and said first layer of insulating material so as to thereby form a space between said first layer of insulating material and said first liner layer; and
   forming a second layer of insulating material above said first layer of insulating material.

2. The method of claim 1, wherein said sidewall spacer and said second liner layer are comprised of silicon nitride and said first liner layer and said first layer of insulating material are comprised of silicon dioxide.

3. The method of claim 2, wherein said second layer of insulating material is comprised of silicon dioxide.

4. The method of claim 1, wherein said gate structure comprises a sacrificial gate electrode.

5. The method of claim 1, wherein, after forming said second layer of insulating material, said space between said first layer of insulating material and said first liner layer remains substantially unfilled.

6. The method of claim 1, further comprising:
   performing at least one etching process to remove at least portions of said first and second layers of insulating material and at least portions of said first liner layer so as to thereby expose an outer surface of said sidewall spacer; and
   forming a conductive contact that is in physical contact with said exposed outer surface of said sidewall spacer and conductively coupled to a source/drain region of said transistor.

7. The method of claim 1, wherein said first and second layers of insulating material are comprised of silicon dioxide or a material having a dielectric constant less than 3.

8. The method of claim 1, wherein said second layer of insulating material covers an upper portion of a sidewall surface of said first liner layer.

9. A method of forming a transistor, comprising:
   forming a gate structure above a semiconductor substrate;
   forming a sidewall spacer adjacent said gate structure;
   forming a first liner layer on at least said sidewall spacer;
   forming a second liner layer on said first liner layer;
   forming a first layer of insulating material above said substrate and adjacent said second liner layer;
   performing at least one first etching process to selectively remove at least portions of said second liner layer relative to said first liner layer;
   forming a second layer of insulating material above said first layer of insulating material;
   performing at least one second etching process to remove at least portions of said first and second layers of insulating material and at least portions of said first liner layer so as to thereby expose an outer surface of said sidewall spacer; and
   forming a conductive contact that is in physical contact with said exposed outer surface of said sidewall spacer and conductively coupled to a source/drain region of said transistor.

10. The method of claim 9, wherein said sidewall spacer and said second liner layer are comprised of silicon nitride and said first liner layer and said first layer of insulating material are comprised of silicon dioxide.

11. The method of claim 10, wherein said second layer of insulating material is comprised of silicon dioxide.

12. The method of claim 9, wherein said gate structure comprises a sacrificial gate electrode.

13. The method of claim 9, wherein said first and second layers of insulating material are comprised of silicon dioxide or a material having a dielectric constant less than 3.

14. A transistor device, comprising:
- a gate structure positioned above a semiconductor substrate;
- a sidewall spacer positioned adjacent opposite sides of said gate structure;
- a first layer of insulating material positioned above said substrate, said first layer of insulating material being laterally spaced apart from and not in contact with said sidewall spacer;
- a second layer of insulating material positioned above said first layer of insulating material, said second layer of insulating material contacting said sidewall spacer; and
- first and second air gaps positioned on opposite sides of said gate structure, wherein each of said first and second air gaps is defined at least by an outer surface of said sidewall spacer, said first layer of insulating material, said second layer of insulating material, and at least one additional layer of insulating material positioned between said first layer of insulating material and said substrate, said at least one additional layer of insulating material being laterally spaced apart from and not in contact with said sidewall spacer.

15. The device of claim 14, wherein said device further comprises first and second conductive contacts that are positioned on opposite sides of said gate structure, each of said first and second conductive contacts being conductively coupled to a source/drain region of said transistor, wherein said first air gap is positioned between said first conductive contact and said gate structure and said second air gap is positioned between said second conductive structure and said gate structure.

16. The device of claim 14, wherein at least one of said first and second layers of insulating material comprise one of silicon dioxide and a material having a dielectric constant of approximately 3.0 or less.

17. A transistor device, comprising:
- a gate structure positioned above a semiconductor substrate;
- a sidewall spacer positioned adjacent opposite sides of said gate structure;
- a first layer of insulating material positioned above said substrate, said first layer of insulating material being laterally spaced apart from and not in contact with said sidewall spacer;
- a second layer of insulating material positioned above said first layer of insulating material, said second layer of insulating material contacting said sidewall spacer; and
- first and second air gaps positioned on opposite sides of said gate structure, wherein each of said first and second air gaps is defined at least by an outer surface of said sidewall spacer, said first layer of insulating material, said second layer of insulating material, an upper surface of said substrate, and at least one additional layer of insulating material positioned between said first layer of insulating material and said substrate, said at least one additional layer of insulating material being laterally spaced apart from and not in contact with said sidewall spacer.

18. The device of claim 17, wherein said device further comprises first and second conductive contacts that are positioned on opposite sides of said gate structure, each of said first and second conductive contacts being conductively coupled to a source/drain region of said transistor, wherein said first air gap is positioned between said first conductive contact and said gate structure and said second air gap is positioned between said second conductive structure and said gate structure.

19. The device of claim 17, wherein at least one of said first and second layers of insulating material comprise one of silicon dioxide and a material having a dielectric constant of approximately 3.0 or less.

20. A method of forming a transistor, comprising:
- forming a gate structure above a semiconductor substrate;
- forming a sidewall spacer adjacent said gate structure;
- forming a first liner layer on at least said sidewall spacer;
- forming a second liner layer on said first liner layer;
- forming a first layer of insulating material above said substrate and adjacent said second liner layer;
- performing at least one etching process to selectively remove at least portions of said second liner layer relative to said first liner layer and said first layer of insulating material so as to thereby form a space between said first layer of insulating material and said first liner layer; and
- forming a second layer of insulating material above said first layer of insulating material, wherein, after forming said second layer of insulating material, said space between said first layer of insulating material and said first liner layer remains substantially unfilled.

21. A method of forming a transistor, comprising:
- forming a gate structure above a semiconductor substrate;
- forming a sidewall spacer adjacent said gate structure;
- forming a first liner layer on at least said sidewall spacer;
- forming a second liner layer on said first liner layer;
- forming a first layer of insulating material above said substrate and adjacent said second liner layer;
- performing at least one etching process to selectively remove at least portions of said second liner layer relative to said first liner layer and said first layer of insulating material so as to thereby form a space between said first layer of insulating material and said first liner layer;
- forming a second layer of insulating material above said first layer of insulating material;
- performing at least one etching process to remove at least portions of said first and second layers of insulating material and at least portions of said first liner layer so as to thereby expose an outer surface of said sidewall spacer; and
- forming a conductive contact that is in physical contact with said exposed outer surface of said sidewall spacer and conductively coupled to a source/drain region of said transistor.

* * * * *